(12) United States Patent
Park

(10) Patent No.: US 6,563,187 B1
(45) Date of Patent: May 13, 2003

(54) CMOS IMAGE SENSOR INTEGRATED TOGETHER WITH MEMORY DEVICE

(75) Inventor: Sang Hoon Park, Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/342,343

(22) Filed: Jun. 29, 1999

(30) Foreign Application Priority Data

Jun. 29, 1998 (KR) ............................................ 98-24711

(51) Int. Cl.[7] .............................................. H01L 31/00
(52) U.S. Cl. ...................... 257/446; 257/291
(58) Field of Search ................................ 257/291, 292, 257/293, 443, 444, 446

(56) References Cited

U.S. PATENT DOCUMENTS

| | | | | |
|---|---|---|---|---|
| 5,225,696 A | * | 7/1993 | Bahraman .................... 257/448 |
| 5,461,425 A | * | 10/1995 | Fowler et al. ............... 348/294 |
| 5,614,744 A | * | 3/1997 | Merrill ........................ 257/291 |
| 5,665,959 A | * | 9/1997 | Fossum et al. ........... 250/208.1 |
| 5,694,143 A | * | 12/1997 | Fielder et al. ............... 345/112 |
| 5,708,263 A | * | 1/1998 | Wong ....................... 250/208.1 |
| 5,841,159 A | * | 11/1998 | Lee et al. .................... 257/291 |
| 6,066,090 A | * | 5/2000 | Yoon ........................... 600/113 |
| 6,445,014 B1 | * | 9/2002 | Rhodes et al. .............. 257/185 |

FOREIGN PATENT DOCUMENTS

WO    WO 97/24728    *  7/1997

* cited by examiner

*Primary Examiner*—Sara Crane
(74) *Attorney, Agent, or Firm*—Townsend and Townsend and Crew LLP

(57) ABSTRACT

The present invention relates to a CMOS (Complementary Metal Oxide Silicon) image sensor; and, more particularly, to an image sensor integrated into one chip, together with a memory. The CMOS image sensor according to the present invention comprises: a pixel array formed on a chip, having a plurality of unit pixels; a logic circuit formed on the chip to process signals form the pixel array; and a memory formed on the chip to store outputs from the logic circuit, wherein the pixel array, the logic circuit and the memory are isolated from each other by insulating layers, whereby the pixel array, the logic circuit and the memory are integrated on the same chip.

14 Claims, 11 Drawing Sheets

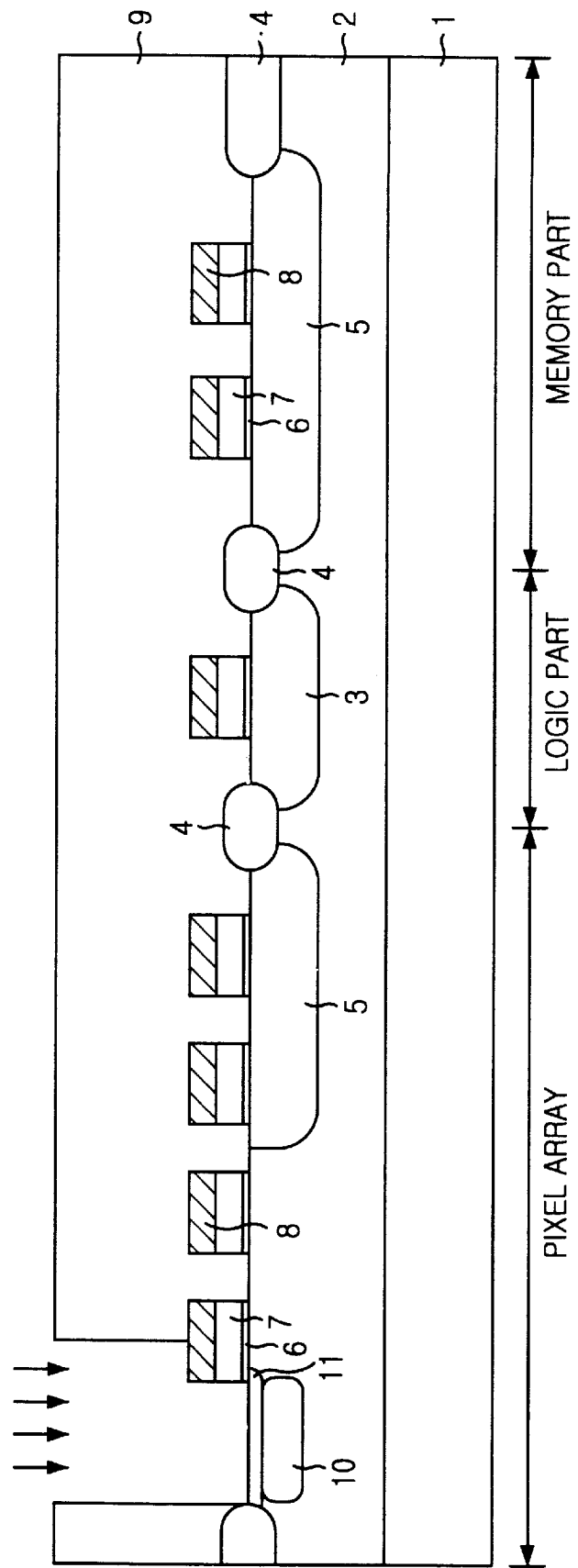

CMOS IMAGE SENSOR INTEGRATED TOGETHER WITH MEMORY DEVICE

FIELD OF THE INVENTION

The present invention relates to a CMOS (Complementary Metal Oxide Silicon) image sensor; and, more particularly, to an image sensor integrated into one chip, together with a memory.

DESCRIPTION OF THE PRIOR ART

Generally, a CCD (charge coupled device) image sensor has many demerits in that complicated operation methods, large power consumption and a number of mask processes are required. Furthermore, it is very difficult to make a signal processing circuit integrated into a CCD chip. Accordingly, in order to overcome such demerits, many developments for a CMOS image sensor have been recently ensued using a submicron CMOS manufacturing technique. A CMOS image sensor creates a picture by detecting signals from photodiodes and MOS transistors formed within a unit pixel. The use of a CMOS manufacturing technique can reduce power consumption compared with a CCD, which requires 30 to 40 mask processes, the CMOS image sensor only approximately 20 mask processes are required, thereby simplifying the manufacturing process. Furthermore, since an image signal processing circuit is integrated together with light sensing elements in one chip, it is highlighted as a next generation image sensor.

The integration of a pinned photodiode and a CMOS circuit is disclosed in U.S. patent application Ser. No. 09/258,814 filed on Feb. 26, 1999, entitled "CMOS Image Sensor with Equivalent Potential Diode and Method for Fabricating the Same" which is pending. In the U.S. patent application Ser. No. 09/258,814, a method for maximizing the production and quantum efficiency of photoelectric charges generated by incident light and the transfer efficiency to transfer the photoelectric charges to a sensing node is disclosed.

On the other hand, U.S. Pat. No. 5,459,508, entitled "Image Processing Apparatus," discloses an apparatus for electrically recording image data, by implementing a memory control system which stores data outputted from image sensors in DRAM chips of, at least, more than 1.

However, in the conventional image sensor, since memories, such as DRAMs, and the image sensors are manufactured on different chips from each other, the use of the separate chips makes the miniaturization of the image system difficult, manufacturing cost more expensive, despite the use of a CMOS manufacturing technique, and even the power consumption is not remarkably reduced.

SUMMARY OF THE INVENTION

It is, therefore, an object of the present invention to provide a CMOS image sensor integrated together with a memory device in order to minimize a system to which the CMOS image sensor is applied and reduce the cost and power consumption.

In accordance with an aspect of the present invention, there is provided a CMOS image sensor comprising: a pixel array formed on a chip, having a plurality of unit pixels; a logic circuit formed on the chip to process signals from the pixel array; and a memory formed on the chip to store outputs from the logic circuit, wherein the pixel array, the logic circuit and the memory are isolated from each other by insulating layers, whereby the pixel array, the logic circuit and the memory are integrated on the same chip.

In accordance with another aspect of the present invention, there is provided a CMOS image sensor comprising: a chip divided into first to third sections; a unit pixel array formed on the first section; a logic circuit formed on the second section to process signals form the pixel array; and a memory formed on the third section to store outputs from the logic circuit, wherein the first to third sections are isolated from each other by insulating layers.

BRIEF DESCRIPTION OF THE DRAWINGS

Other objects and aspects of the invention will become apparent from the following description of the embodiments with reference to the accompanying drawings, in which:

FIGS. 2A to 2J are cross-sectional views illustrating a chip on which a CMOS image sensor and a DRAM are integrated in accordance with the present invention.

DETAILED DESCRIPTION OF THE INVENTION

Hereafter, the present invention will be described in detail with reference to the accompanying drawings.

Figure 1:
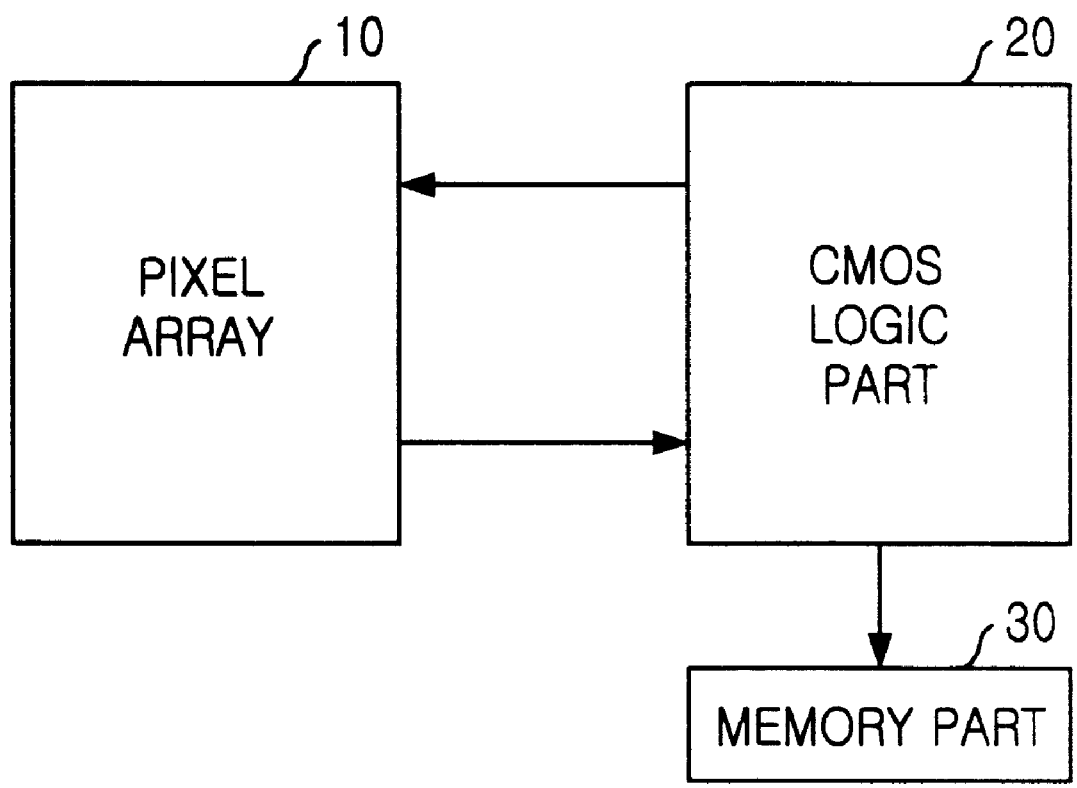
FIG. 1 is a schematic diagram illustrating a CMOS image sensor in accordance with the present invention.

FIG. 1 is a schematic diagram illustrating a CMOS image sensor in accordance with the present invention. As illustrated in FIG. 1, a CMOS image sensor in accordance with the present invention includes a pixel array 10 where pixels having photodiodes are arrayed, a CMOS logic part 20 for controlling the pixel array 10 and processing output signal from the pixel array 10 and a memory part 30 for storing image data processed in the CMOS logic part 20. The pixel array 10, the CMOS logic part 20 and the memory part 30 are integrated into one chip. Also, the memory part 30 may be composed of DRAMs or SRAMs.

FIGS. 2A to 2J are cross-sectional views illustrating a chip on which a CMOS image sensor and a DRAM are integrated in accordance with the present invention. In order to simplify the explanation, a pixel array, a CMOS logic part and a memory part are respectively shown in FIGS. 2A to 2J and each of them occupies a specific area on the one chip.

Figure 2A:
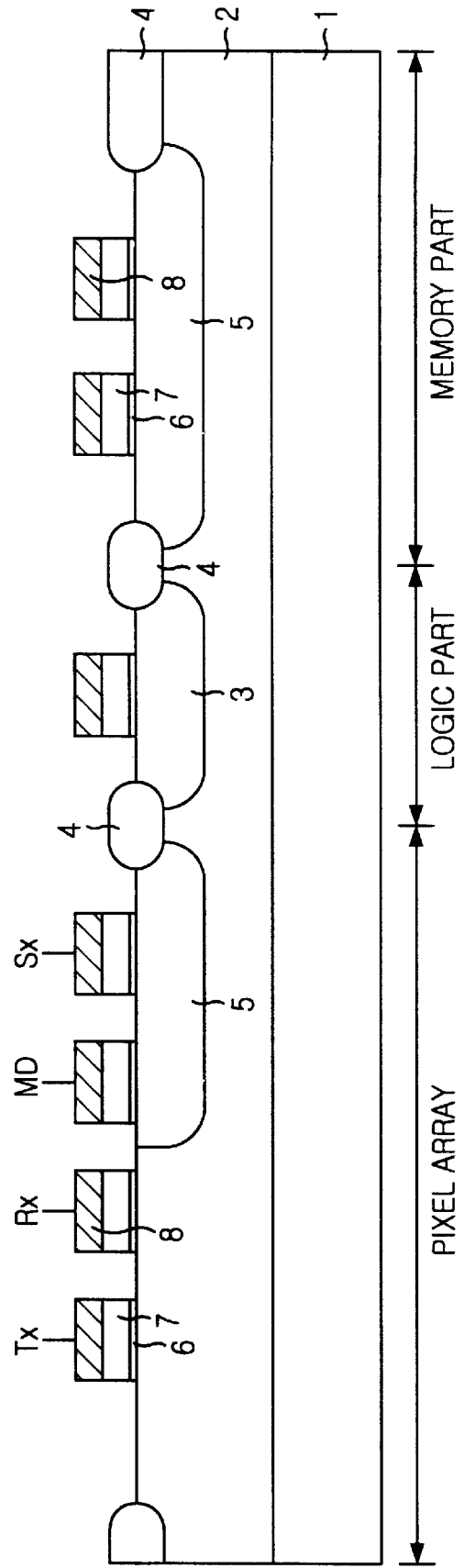

First, referring now to FIG. 2A, a P well 5 is formed in a P type epitaxial silicon layer 2 having a resistance of approximately 10 to 100 $\Omega$cm. In addition, the P type epitaxial silicon layer 2 is formed on a silicon substrate 1 and, typically, a concentration of the P type epitaxial silicon layer 2 is lower than that of a silicon substrate 1. An N-well 3 is formed in the CMOS logic part, by ion-implanting P-type impurities into the P type epitaxial silicon layer 2 in conditions of an energy of approximately 1 to 2 KeV and a dose of 7E12 to 1E14 ions/cm$^2$. Field oxide layers 4 are formed to a thickness of approximately 3,000 to 5,000 Å in order to isolate elements from each other. Subsequently, P-wells 5 are formed in the pixel array and memory part, by ion-implanting B atoms in conditions of energy of approximately 100 to 500 KeV and a dose of 1E12 to 1E14 ions/CM$^2$. Next, gate oxide layers 6 and gate electrodes 7 are formed by carrying out the thermal treatment process at approximately 950° C. for around 30 minutes, and mask oxide layers 8 are also formed on the gate electrodes 7. A doped polysilicon layer and various kinds of silicide layers may be used as a conducting layer for the gate electrodes 7. These typical transistors are well-known to those skilled in the art, so further explanation will be omitted in the present invention.

Referring to FIG. 2B, a first photoresist pattern 9 used as an ion implanting mask is formed, exposing a light sensing area in which the pinned photodiode is formed. At this time, an edge of the first photoresist pattern 9 is positioned on one (neighboring gate electrode) of the gate electrodes 7 so that the pinned photodiode is self-aligned to the neighboring gate electrode. Next, an N⁻ region 10 is formed by ion-implanting P atoms into the high sensing area in conditions of an energy of approximately 150 to 500 KeV and a dose of 3E12 to 5E12 ions/cm², using the first photoresist pattern 9 and mask oxide pattern 8 as ion implantation masks and further, a P⁰ region 11 is formed by ion-implanting $BF_2$ in conditions of an energy of approximately 20 to 40 KeV and a dose of 1E13 to 3E13 ions/cm². In the preferred embodiment of the present invention, an additional ion implantation mask may be needed to form the P⁰ region 11. By portioning a portion of the P⁰ region 11 on the P type epitaxial silicon layer 2, the N⁻ region 10 is fully depleted at low voltage. This concept is disclosed in the above mentioned U.S. patent application Ser. No. 09/258,814.

Figure 2C:
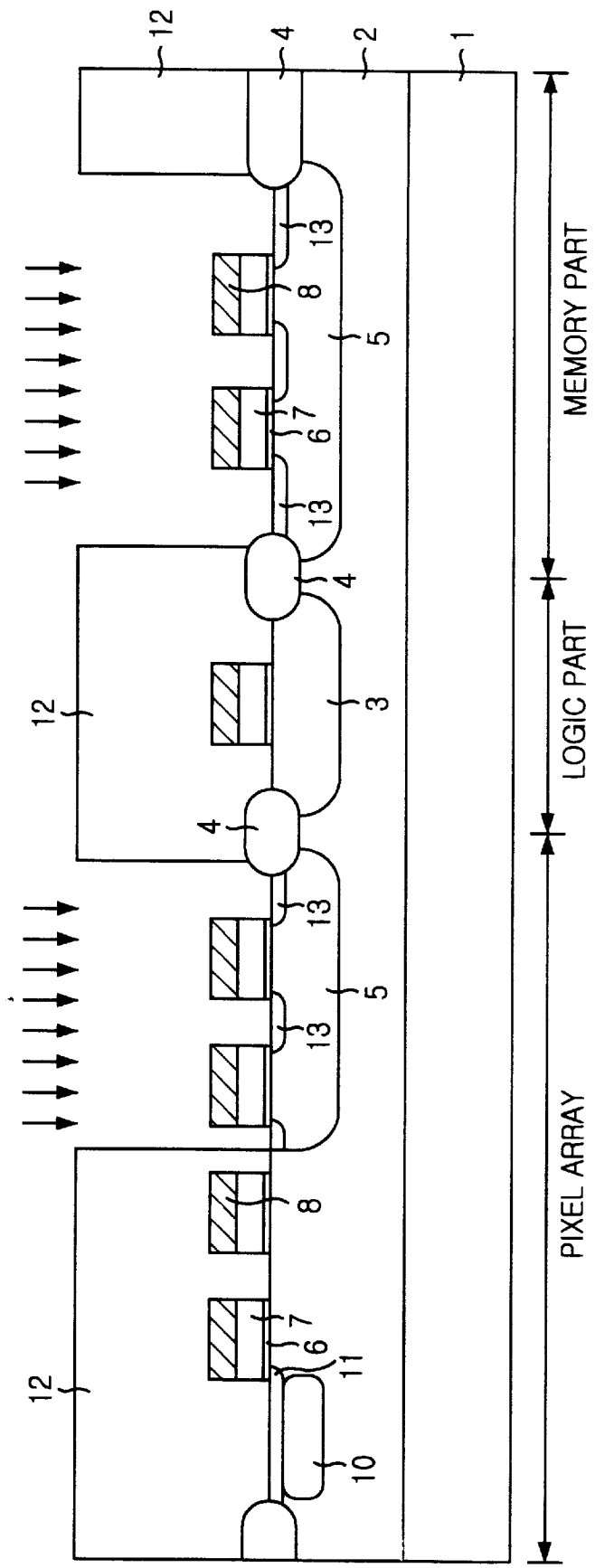

Next, referring to FIG. 2C, after removing the first photoresist layer pattern 9, a second photoresist layer 12 exposing the P-well regions 5 is formed and N⁻ LDD (Lightly Doped Drain) regions 13 are formed by ion-implanting P atoms into the P-well regions 5 in conditions of an energy of approximately 10 to 60 KeV and a dose of 1E13 to 5E13 ions/cm².

Figure 2D:
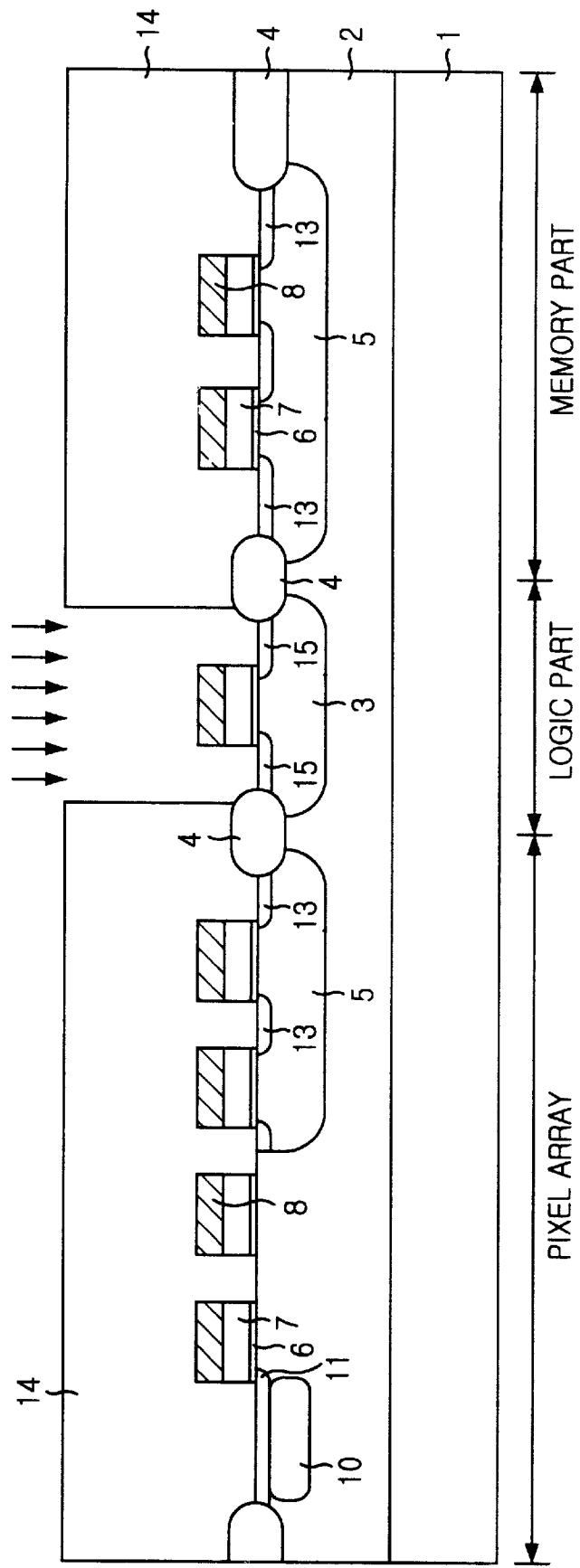

Referring to FIG. 2D, after removing the second photoresist layer pattern 12, a third photoresist layer 14 exposing the N-well region 3 is formed and P– LDD (Lightly Doped Drain) regions 15 are formed by ion-implanting N-type atoms into the N-well region 3 in conditions of an energy of approximately 20 to 60 KeV and a dose of 1E13 to 5E13 ions/cm².

Figure 2E:
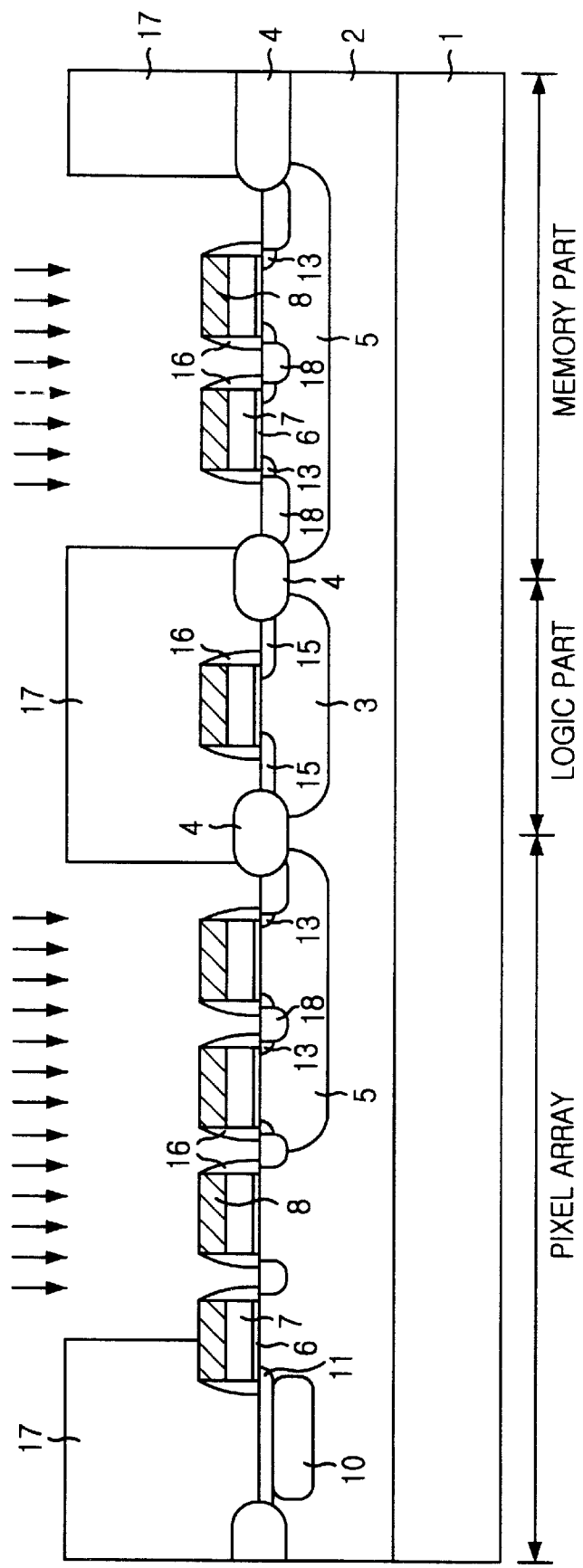

Referring to FIG. 2E, after removing the third photoresist layer pattern 14, a TEOS (tetraethoxysilane) layer is formed by the LPCVD process to a thickness of approximately 2,000 to 2,500 Å on the resulting structure. By anisotropically etching back the TEOS layer, oxide layer spacers are formed on the sidewalls of the gate electrodes. Further, N+ regions 18 for source/drain electrode are formed by forming a fourth photoresist layer 17 covering pinned photodiode region and the CMOS logic part and ion-implanting As atoms in conditions of an energy of approximately 20 to 90 KeV and a dose of 1E15 to 9E15 ions/cm².

Figure 2F:
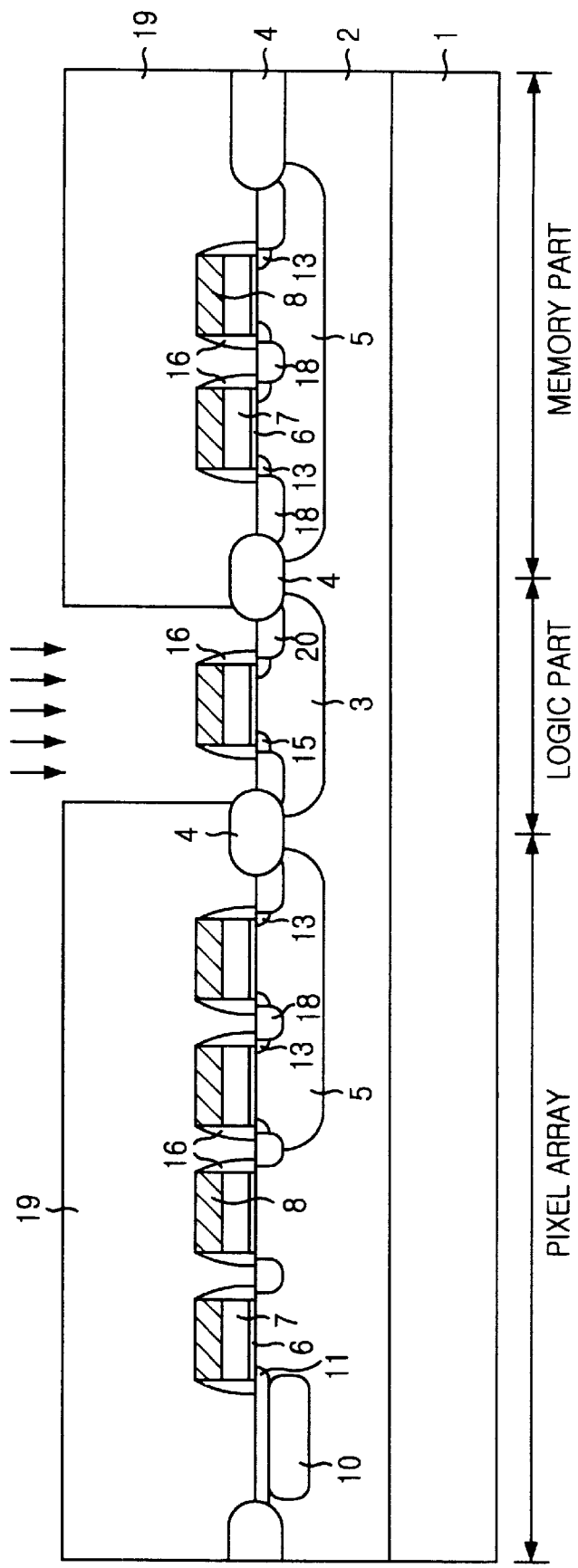

Referring to FIG. 2F, after removing the fourth photoresist layer pattern 17, a fifth photoresist layer pattern 19 opening the N-well 3 is formed on the resulting structure. Then, P⁺ regions 20 for source/drain electrode is formed by ion-implanting $BF_2$ into the N-well region 3 in conditions of an energy of approximately 20 to 90 KeV and a dose of 1E15 to 9E15 ions/cm².

Figure 2G:
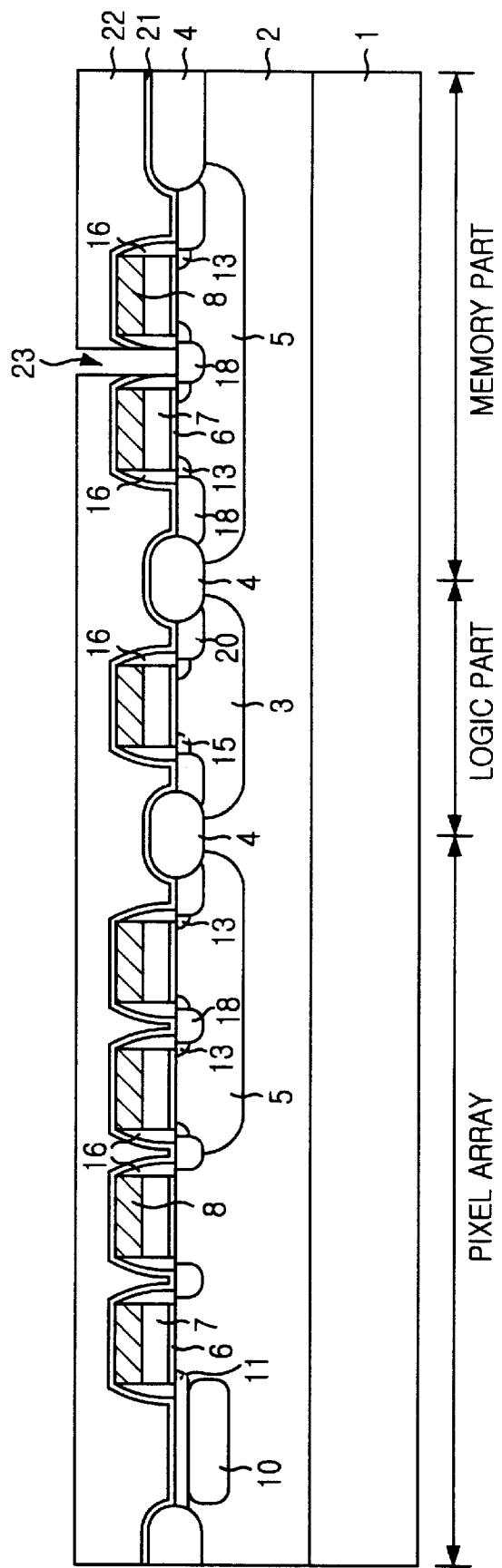

Referring to FIG. 2G, after removing the fifth photoresist layer pattern 19, an oxide layer 21 is deposited on the resulting structure to a thickness of approximately 500 to 1,000 Å and a BPSG (borophosphosilicate glass) layer 22 are deposited on the oxide layer 21 to a thickness of approximately 2,000 to 5,000 Å. Then, a contact hole 23 exposing the source/drain regions of the transistors' in memory part is formed in order to connect a bit line to the source/drain regions.

Figure 2H:
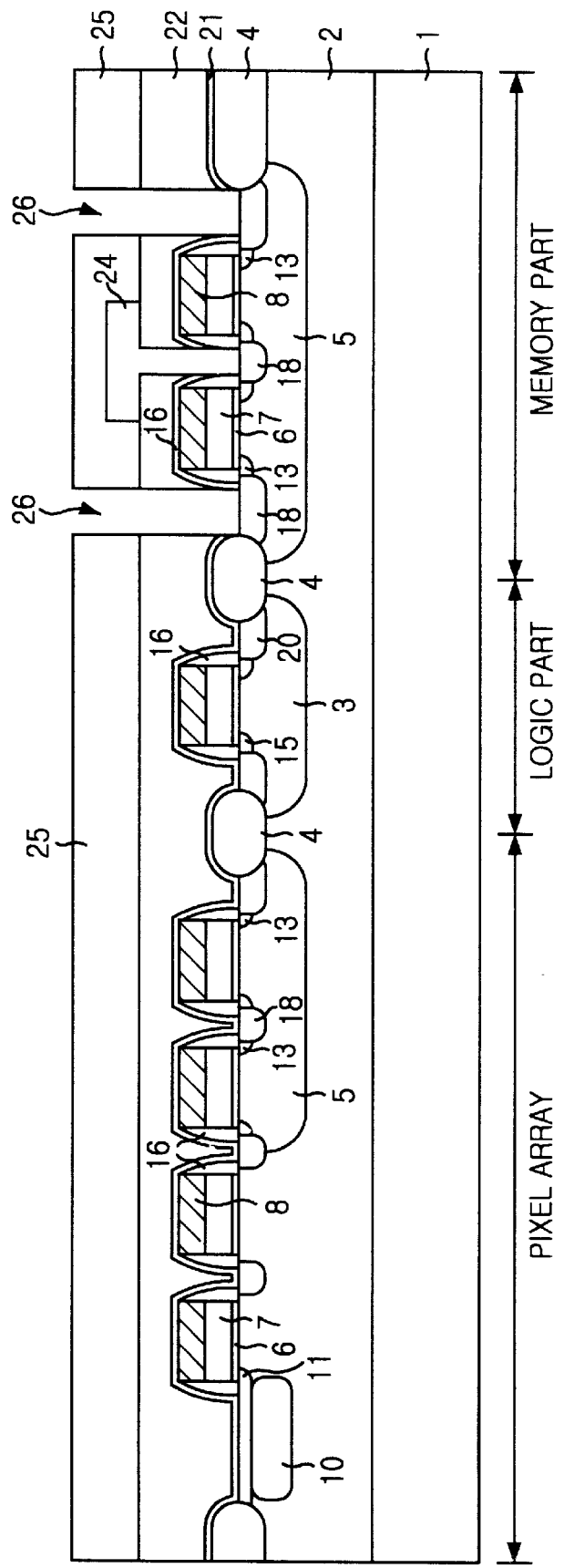
Figure 21:
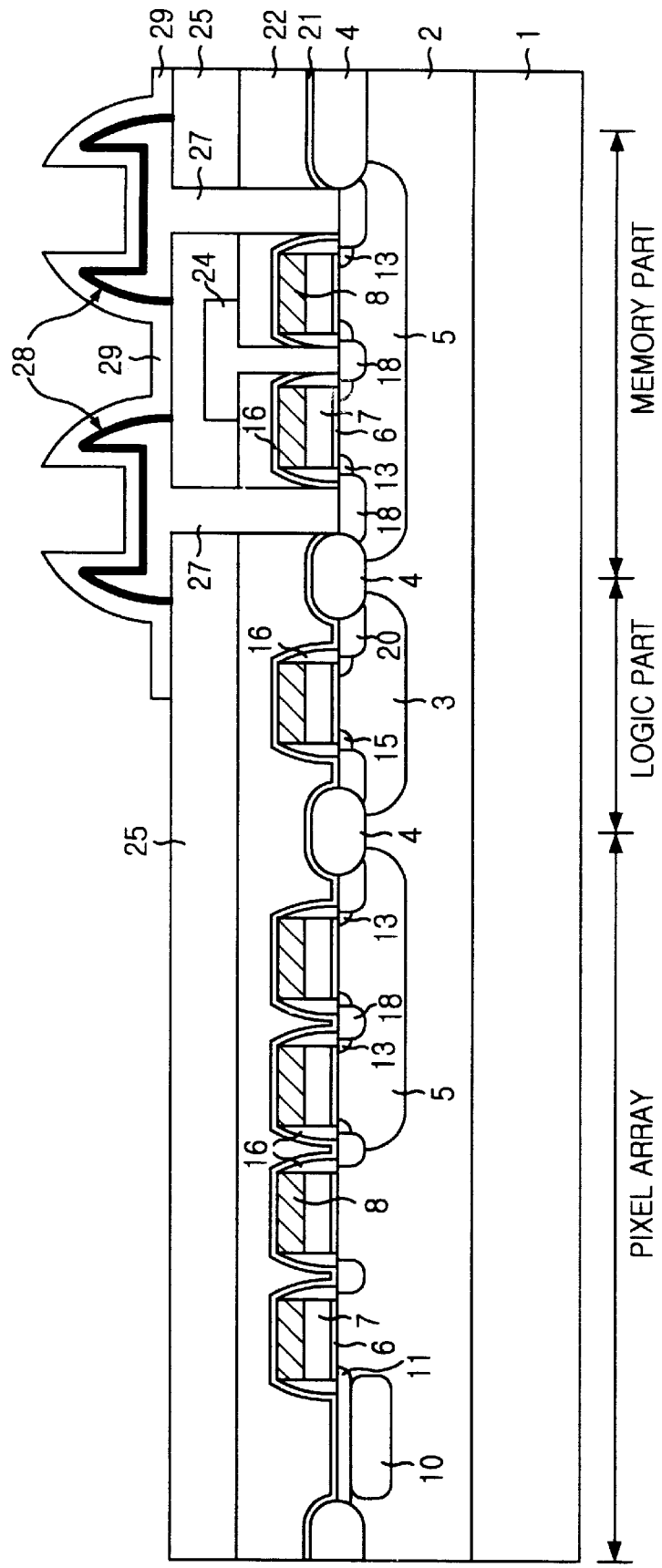

Referring to FIG. 2H, a bit line pattern 24 composed of polysilicon layer having a thickness of approximately 500 Å and a silicide layer (not shown) having a thickness of approximately 1,000 Å is formed first and, next, an interlayer insulating layer 25 having a thickness of approximately 1,500 to 2,500 Å is formed on the resulting structure. Finally, a storage node contact hole 26 for capacitor is formed in memory part.

Referring to FIG. 2I, a storage node 27 of a cylinder type, a dielectric layer 28 and a plate electrode 29 are formed in this order.

Figure 2J:
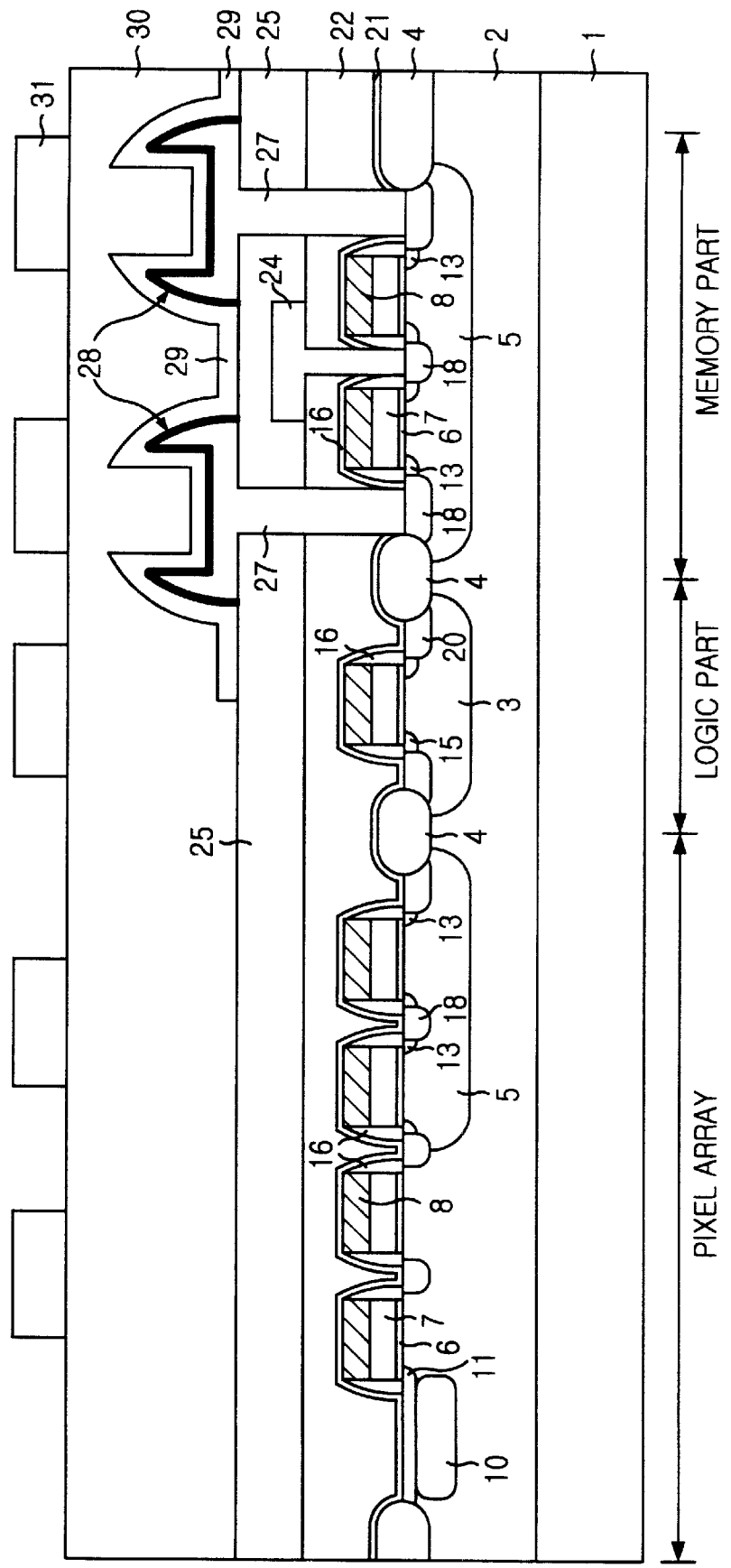

Referring to FIG. 2J, after forming an interlayer insulating layer 30 to a thickness of approximately 13,000 to 15,000 Å on the resulting structure and etching back the interlayer insulating layer 30, metal wires 31 are formed.

As apart from the above, the present invention leads the CMOS image sensor to be integrated together with a memory. Accordingly, the present invention minimizes the CMOS image system.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CMOS image sensor on an integrated circuit, comprising:
    a pixel array formed in a first dielectrically isolated well on a chip, having a plurality of unit pixels that detect light from an object;
    a logic circuit formed in a second dielectrically isolated well on the chip to process signals from the pixel array; and
    a memory formed in a third dielectrically isolated well on the chip to store outputs from the logic circuit, wherein the pixel array, the logic circuit and the memory are isolated from each other by insulating layers, and wherein the pixel array, the logic circuit and the memory are integrated on the same chip.

2. The CMOS image sensor as recited in claim 1, wherein the unit pixels comprise a plurality of pinned photodiodes.

3. The CMOS image sensor as recited in claim 1, wherein the memory comprises DRAM devices.

4. A CMOS image sensor, comprising:
    a chip divided into first, second and third sections, the sections being formed in a single P-type layer;
    a unit pixel array formed in the first section operable to detect light from an object;
    a logic circuit formed in the second section operable to process signals from the pixel array; and
    a memory formed in the third section operable to store outputs from the logic circuit, wherein the first, second and third sections are isolated from each other by insulating layers.

5. The CMOS image sensor as recited in claim 4, wherein the unit pixel array comprises a plurality of pinned photodiodes.

6. The CMOS image sensor as recited in claim 4, wherein the memory comprises DRAM devices.

7. The CMOS image sensor of claim 4 wherein the P-type layer has a resistance of approximately 10 to 100 Ωcm.

8. The CMOS image sensor of claim 4 wherein
    the pixel array comprises a first P-type well;
    the memory comprises a second P-type well;
    the logic circuit comprises an N-type well; and
    the first P-type well, the second P-type well and the N-type well are formed in the P-type layer.

9. A CMOS image sensor, comprising:
    a pixel array formed on a chip, having a plurality of unit pixels that detect light from an object;
    a logic circuit formed on the chip to process signals from the pixel array;

a memory formed on the chip to store outputs from the logic circuit;

the pixel array, the logic circuit and the memory are integrated on the same chip; and wherein each of the pixel array and the memory comprise one or more N⁻ LDD (lightly doped drain) regions, and the logic circuit comprises one or more P⁻ LDD (lightly doped drain) regions.

10. The CMOS image sensor of claim 9 wherein the memory comprises a storage node layered with a dielectric layer and a plate electrode.

11. A CMOS image sensor, comprising:

a pixel array formed on a chip, having a plurality of unit pixels that detect light from an object;

a logic circuit formed on the chip to process signals from the pixel array;

a memory formed on the chip to store outputs from the logic circuit; and wherein the pixel array, the logic circuit and the memory are integrated on a single chip, and one or more insulating layers are layered on the pixel array, the logic circuit and the memory.

12. The CMOS image sensor of claim 11 wherein the insulating layer has a thickness of 1,500 Å to 2,500 Å.

13. The CMOS image sensor of claim 1 wherein the single substrate is an N-type layer on a P-type epitaxial layer.

14. The CMOS image sensor of claim 1 wherein the first dielectrically isolated well is a P-well, the second dielectrically isolated well is a P-well and the third dielectrically isolated well is an N-well.

* * * * *